(12) United States Patent
Hossain et al.

(10) Patent No.: US 6,982,461 B2
(45) Date of Patent: Jan. 3, 2006

(54) LATERAL FET STRUCTURE WITH IMPROVED BLOCKING VOLTAGE AND ON RESISTANCE PERFORMANCE AND METHOD

(75) Inventors: Zia Hossain, Tempe, AZ (US); Shanghui Tu, Phoenix, AZ (US); Takeshi Ishiguro, Aizuwakamatsu (JP); Rajesh S. Nair, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/729,292

(22) Filed: Dec. 8, 2003

(65) Prior Publication Data

US 2005/0127438 A1 Jun. 16, 2005

(51) Int. Cl.
*H01L 29/76* (2006.01)
*H01L 29/94* (2006.01)

(52) U.S. Cl. ................ 257/341; 257/343; 257/394
(58) Field of Classification Search .. 257/341–343,394
See application file for complete search history.

(56) References Cited

U.S. PATENT DOCUMENTS

| 5,258,636 | A | | 11/1993 | Rumennik et al. |
| 5,313,082 | A | * | 5/1994 | Eklund ...................... 257/262 |
| 5,633,521 | A | | 5/1997 | Koishikawa |
| 5,910,670 | A | * | 6/1999 | Ludikhuize ................ 257/343 |
| 6,448,625 | B1 | | 9/2002 | Hossain et al. |
| 6,489,653 | B2 | * | 12/2002 | Watanabe et al. .......... 257/343 |
| 6,555,883 | B1 | | 4/2003 | Disney et al. |

* cited by examiner

*Primary Examiner*—Tom Thomas
*Assistant Examiner*—Joseph Nguyen
(74) *Attorney, Agent, or Firm*—Kevin B. Jackson

(57) ABSTRACT

In one embodiment, a lateral FET structure (30) is formed in a body of semiconductor material (32). The structure (30) includes a plurality non-interdigitated drain regions (39) that are coupled together with a conductive layer (57), and a plurality of source regions (34) that are coupled together with a different conductive layer (51). One or more interlayer dielectrics (53,54) separate the two conductive layers (51,57). The individual source regions (34) are absent small radius fingertip regions.

9 Claims, 5 Drawing Sheets

LATERAL FET STRUCTURE WITH IMPROVED BLOCKING VOLTAGE AND ON RESISTANCE PERFORMANCE AND METHOD

BACKGROUND OF THE INVENTION

This invention relates generally to semiconductor devices, and more specifically to lateral field effect transistor (FET) structures and methods of manufacture.

Metal-oxide semiconductor field effect transistors (MOSFETs) are a common type of integrated circuit device. A MOSFET device includes a source region, a drain region, a channel region extending between the source and drain regions, and a gate provided over the channel region. The gate includes a conductive gate structure disposed over and separated from the channel regions with a thin dielectric layer.

Lateral MOSFET devices are common devices used in high voltage (i.e., greater than 200 volts) applications such as off-line switching regulators in AC/DC voltage conversion. Lateral MOSFET devices typically comprise a source region and a drain region separated by an intermediate or drift region. A gate structure is disposed over the channel region of the device. In the on state, a voltage is applied to the gate to form a conduction channel region between the source and drain regions, which allows current to flow through the device. In the off state, voltage applied to the gate is sufficiently low so that a conduction channel does not form, and thus current flow does not occur. During the off state, the device must support a high voltage between the source and drain regions.

Lateral power FET devices typically are designed with source and drain regions that are elongated (i.e., much longer than they are wide), and interdigitated. In such designs, the source and drain regions typically terminate with source tips and drain tips respectively. FIG. 1 illustrates a top plan view of a typical prior art interdigitated lateral power FET 10 having source regions 11 interdigitated with drain regions 12. Source regions 11 are interconnected with or by a common diffused region 16, and drain regions 12 are interconnected with or by a common diffused region 17. Source regions 11 are formed within p+ high voltage (PHV) regions 13, and drain regions 12 are formed in n-well regions 14. This interdigitated design results in fingertips 18 and 19 on PHV regions 13 and drain regions 12 respectively.

In order for device 10 to withstand large blocking voltages (e.g., greater than 200 volts), special precaution must be taken to design termination regions for fingertips 18 because of electrical field crowding caused by the small radius of curvature of fingertip 18. Such electrical field crowding can lead to degraded blocking voltage performance or device failure.

To avoid degraded blocking voltage, device 10 includes a cut-out region 21 around fingertips 18 of PHV regions 13. As shown in FIG. 2, which is a highly enlarged partial cross-sectional view of device 10 taken along reference line 2—2, cut-out region 21 comprises a region of underlying substrate 26 wherein n-well 14 is pulled back to effectively increase the radius of curvature of fingertip 18, which reduces electrical field crowding. Cut-out regions 21 further comprise an "x" dimension and a "y" dimension that must be modified and optimized depending on desired blocking voltage characteristics.

Several problems exist with the design of device 10. For example, design parameters (e.g., x and y dimensions) are not well scalable with blocking voltage. This requires designers to perform multiple design iterations to optimize the design of fingertips 18 and cutout regions 21 if blocking voltage is changed (e.g., from 700 volts to 200 volts). Additionally, variations in wafer fabrication processes (e.g., doping levels and process temperature) result in variations in the characteristics of fingertips 18 (e.g., doping profiles, radius of curvature, etc.), which degrade blocking voltage characteristics and overall device reliability. In addition, because device 10 includes regions such as cut-out regions 21 and common diffused regions 17, the overall size of device 10 becomes larger, which in turn increases specific on resistance (i.e., Ron*Area).

Accordingly, a need exists for structures and methods that improve the blocking voltage capability and Ron*Area performance of lateral MOSFET devices. It would be advantageous for such structures and methods to be flexible to support a number of blocking voltages and to be cost effective.

DETAILED DESCRIPTION OF A PREFERRED EMBODIMENT

In general, the present invention pertains to lateral FET structures with more robust blocking voltage capability and improved on resistance performance. More particularly, the lateral FET structure according to the present invention uses, among other things, one conductive layer to tie source regions together, and a second or different conductive layer to tie drain regions together. Among other things, the structure according to the present invention eliminates electric field crowding issues associated with fingertip regions.

Specifically, the present invention includes a lateral FET structure including a body of semiconductor material having a first conductivity type. A first drain region of a second conductivity type is formed in a portion of the body of semiconductor material, and a second drain region of the second conductivity type is formed in another portion of the body of semiconductor material. Doped high voltage regions of the first conductivity type are formed in the body of semiconductor material substantially surrounding both the first and second drain regions. Source regions of the second conductivity type are formed in the doped high voltage regions, and a gate structure is formed over the first major surface. A first conductive or metal layer is coupled to the source regions to form a source contact, and a second or different conductive layer is coupled to the drain regions to tie the drain regions together. An interlayer dielectric isolates portions of the first and second conductive layers and the gate structure.

The present invention is better understood by referring to FIGS. 3–7 together with the following detailed description. For ease of understanding, like elements or regions are labeled the same throughout the detailed description and FIGURES where appropriate. Although the device according to the present invention is illustrated with specific conductivity types for an n-channel device, the conductivity types may be reversed to provide a p-channel device.

Figure 3:
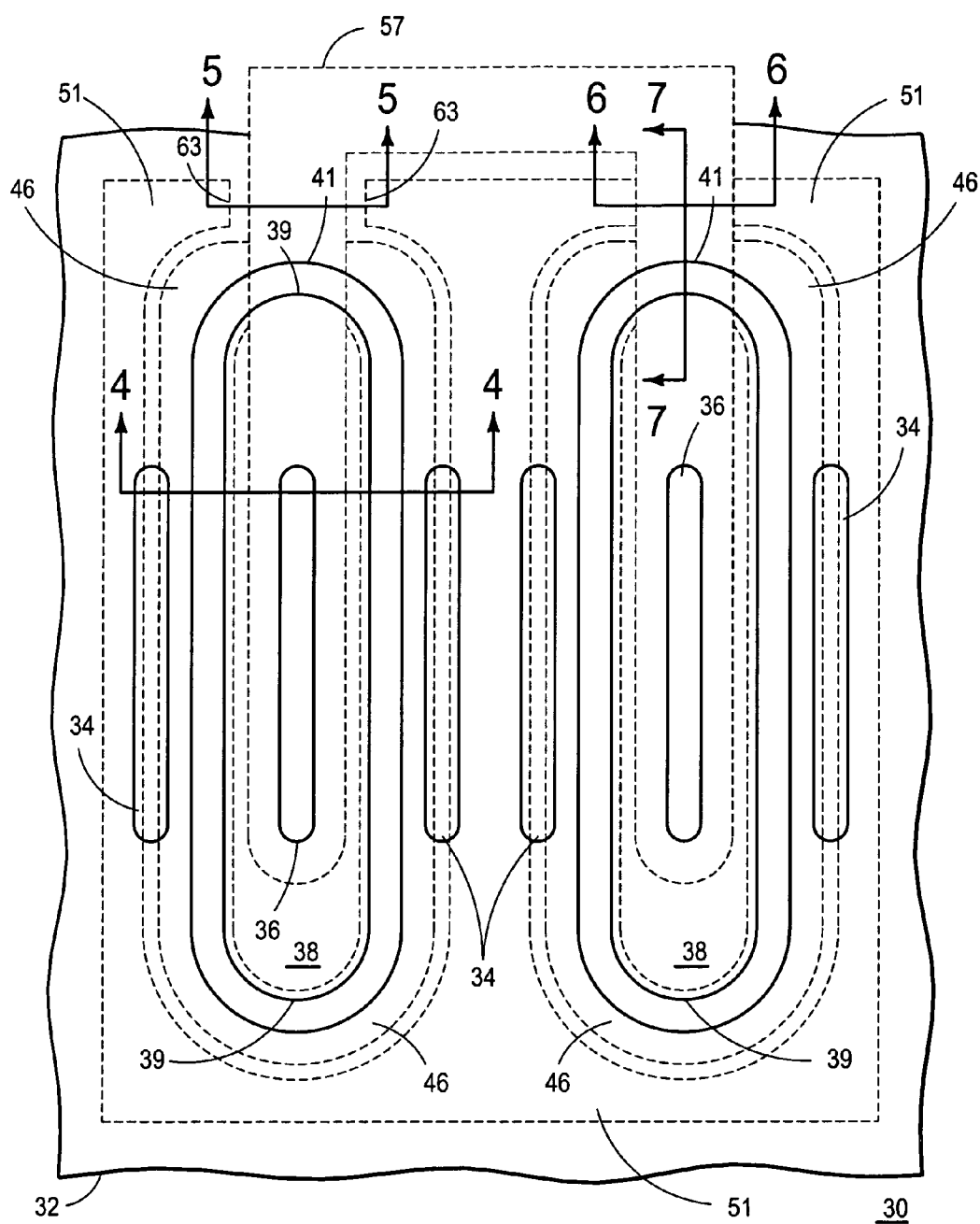
FIG. 3 illustrates a top plan view of a lateral MOSFET device according to the present invention.
Figure 4:
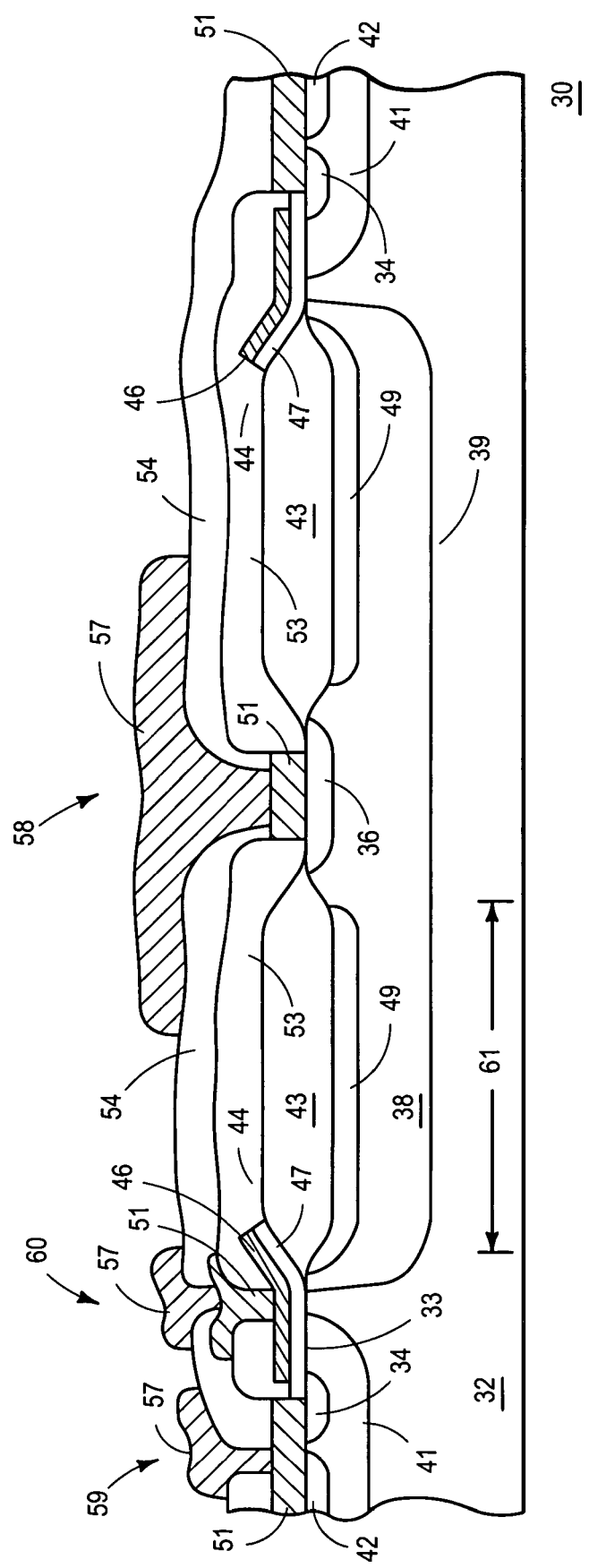
FIG. 4 illustrates an enlarged cross-sectional view of the device of FIG. 3 taken along reference line 4—4.

FIG. 3 shows an enlarged top plan view of a lateral MOSFET device or structure 30 according to the present invention. FIG. 4 shows an enlarged cross-sectional view of device 30 taken along reference 4—4 of FIG. 3. Device 30 includes a body of semiconductor material or semiconductor substrate 32 of a first conductivity type. Semiconductor material 32 includes a major surface or first surface 33. For an n-channel device, body of semiconductor material 32 comprises, for example, a p-type material. The dopant concentration of semiconductor material 32 depends on the desired blocking voltage of device 30. For example, when device 30 comprises a 700 volt device, the dopant concentration of semiconductor material 32 is on the order of $1.5 \times 10^{14}$ atoms/cm$^3$.

Device 30 further includes source regions 34 and drain regions or fingers 39. Drain regions 39 preferably include a well or drift region 38 and a drain contact region 36 within well region 38. Drain contact region 36 and well region 38 comprise the same conductivity type, and drain contact region 36 preferably has a higher dopant concentration or charge density than well region 38.

Preferably, source regions 34 and drain contact regions 36 comprise elongated stripe shapes, are substantially parallel to each other, and have a similar or substantially equal length. In the embodiment shown, source regions 34 and drain contact regions 36 comprise highly doped n-type regions, and well regions 38 comprise more lightly doped n-type regions. As shown in FIG. 3, well regions 38 preferably include a pair of opposing rounded tips or ends.

Figure 1:
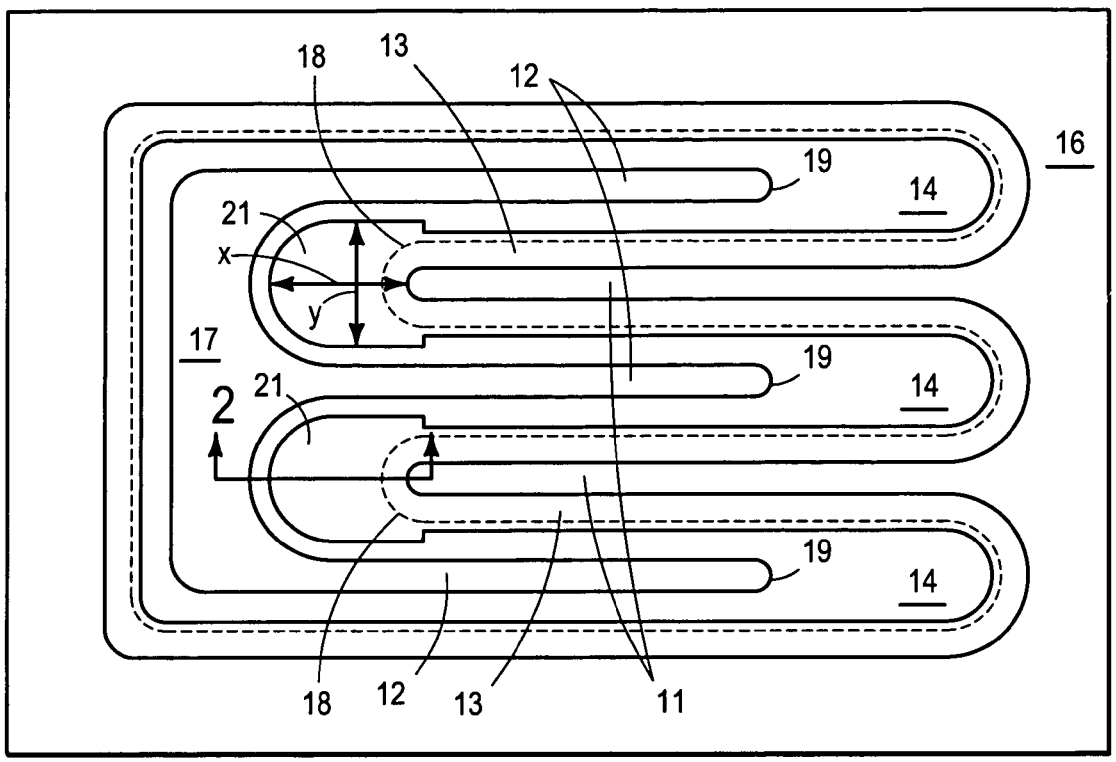
FIG. 1 illustrates a top plan view of a prior art lateral MOSFET device.
Figure 2:
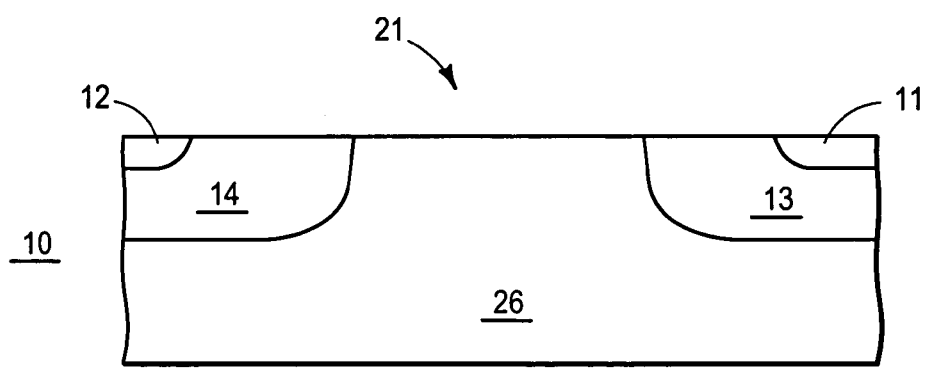
FIG. 2 illustrates an enlarged cross-sectional view of the device of FIG. 1 taken along reference line 2—2.

Source regions 34 are formed within P+ body regions, PHV or doped regions 41 (shown in FIG. 4), which have a higher dopant concentration than body of semiconductor material 32. Preferably, doped regions 41 completely surround well regions 38 and therefore, are absent or without fingertip regions as required by prior art device 10 (i.e., fingertips 18 shown in FIG. 1). This eliminates the regions of high electric field stress caused by small radius of curvature or narrower fingertips. That is, the design and/or shape of doped regions 41 provide a reduced electric field stress and an enhanced blocking voltage capability.

Contact or doped regions 42 are formed within high voltage doped regions 41, and comprise, for example, a highly doped p-type material. Doped regions 42 increase the integrity of the source to substrate connection as well as reduce the device's susceptibility to parasitic bipolar effects.

Gate structures 44 are formed over major surface 33 and comprise a thin dielectric layer 47 and a doped polycrystalline layer or material 46, which provides a gate contact. Field isolation regions 43 provide surface isolation between drain regions 39 and source regions 34. A preferred p-top, doped, or resurf layer or region 49 is included within well region 38 to reduce surface field effects within well region 38, and to improve on resistance. In the embodiment shown, doped region 49 comprises a p-type conductivity material. Doped region 49 is either grounded or left floating.

A first metal or conductive layer 51 is formed on major surface 33 in contact with source regions 34, doped regions 42, drain contact regions 36, and gate structures 44. Preferably, conductive layer 51 comprises an aluminum silicon alloy. A first interlayer dielectric layer (ILD) or dielectric layer 53 is formed over gate structures 44 and field isolation regions 44 to isolate gates structures 44 from first conductive layer 51. A second interlayer dielectric (ILD) 54 is formed over first interlayer dielectric 54 and first conductive layer 51.

According to the present invention, a second or different metal or conductive layer 57 is coupled to drain contact regions 36 through an opening or via 58 in interlayer dielectric layer 54. Additionally, second conductive layer 57 is coupled to source regions 34 and gate structures 44 through vias 59 and 60 as shown. Preferably, second conductive layer 57 comprises an aluminum silicon alloy, and is formed subsequently to first conductive layer 51. First and second interlayer dielectrics 53 and 54 comprise, for example, deposited oxides, and have a total thickness on the order of 15,000 to 20,000 Angstroms.

Although two ILD layers are shown, more or less ILD layers may be used. Additionally, more than two metal layers may be used together with additional ILD layers, and a subsequent conductive layer is used to tie the drain regions together. This subsequent conductive layer would then be considered a second conductive layer, which is coupled through intervening conductive layers to the drain regions. Non-interdigitated drain regions 39 together with interlayer dielectrics 53 and 54 and first and second conductive layers 51 and 57 provide a more robust structure because they provide for the elimination of PHV region fingertips.

A source pad (not shown) is coupled to first conductive layer 51 through a via in ILD layer 54, and comprises, for example, the same material used to form first conductive layer 51 second conductive layer 57. Likewise, a gate pad (not shown) is coupled to gate structure 44 through a via and contact in ILD layers 53 and 54, and comprises, for example, the same material used to form first conductive layer 51 and/or second conductive layer 57. The source and gate pads may be placed around structure 30 where convenient.

The structure 30 according to the present invention is a non-interdigitated finger design where PHV region fingertips are eliminated without sacrificing blocking voltage capability and specific on-resistance characteristics. By non-interdigitated, the authors mean, for example, a structure that is absent a common diffused region (e.g., common diffused region 17 shown in FIG. 1) within the body of semiconductor material that interconnects the drain fingers. Instead, the present invention utilizes a PHV region that substantially surrounds drain regions 39 and a second conductive layer 57 to tie drain regions 39 together. More specifically, structure 30 comprises isolated drain contact regions 36 that are tied together with one more levels of conductive material.

Figure 5:
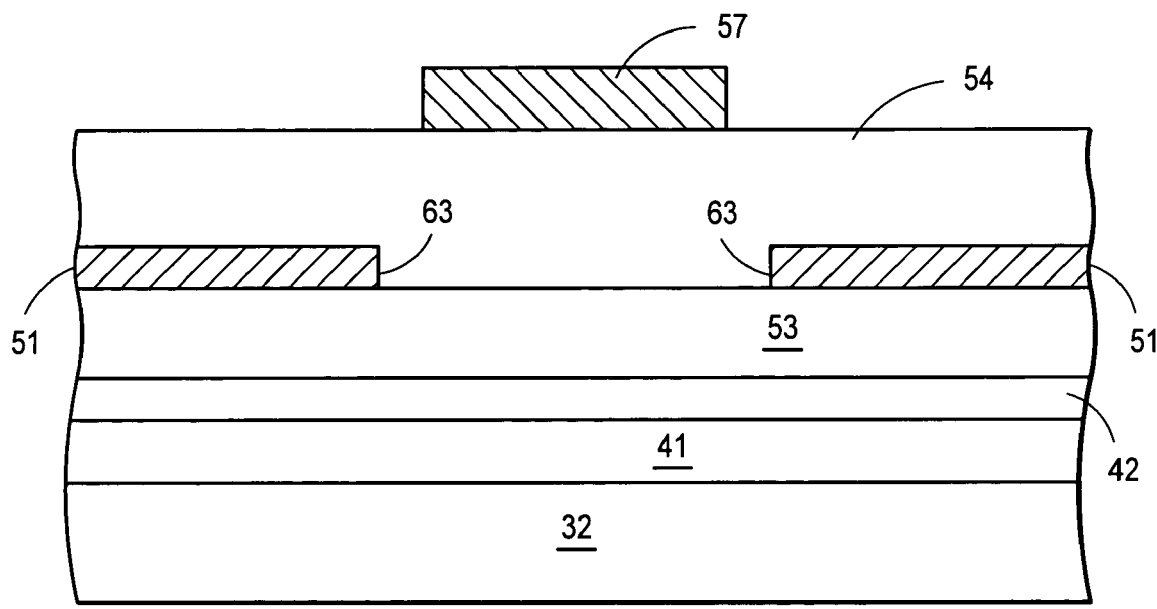
FIG. 5 illustrates an enlarged cross-sectional view of the device of FIG. 3 taken along reference line 5—5.

FIG. 5 illustrates an enlarged cross-sectional view of structure 30 taken along reference line 5—5 to show one embodiment where first conductive layer 51 and second conductive layer 57 do not overlap. That is, FIG. 5 shows portions 63 of first conductive layer 51 terminating in proximity to second conductive layer 57. In applications where high blocking voltage capability is required, this structure is preferred to avoid high electric field stresses on interlayer dielectrics 53 and 54, which can occur when first conductive layer 51 is grounded and second conductive layer 57 is at a high voltage or potential.

Figure 6:
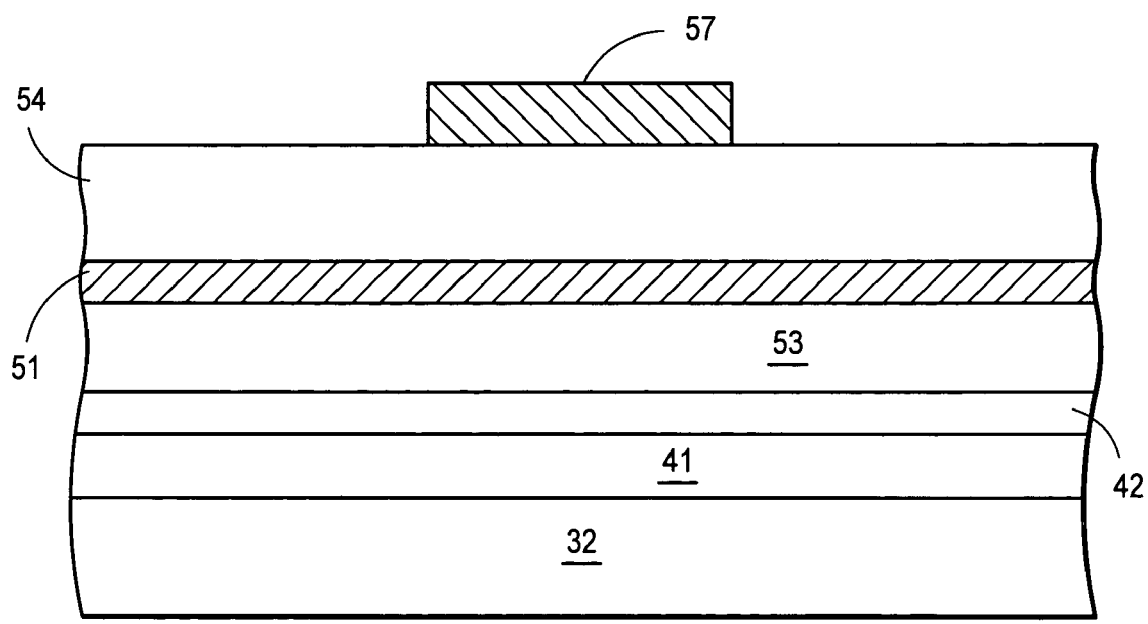
FIG. 6 illustrates an enlarged cross-sectional view of the device of FIG. 3 taken along reference line 6—6.

FIG. 6 illustrates an enlarged cross-sectional view of structure 30 taken along reference line 6—6 to show an alternative embodiment where first conductive layer 51 and second conductive layer overlap, but the two conductive layers are separated and insulated by interlayer dielectric 54. The overall thicknesses of interlayer dielectrics 53 and 54 are adjusted to withstand the specific field stresses of a given device.

Figure 7:
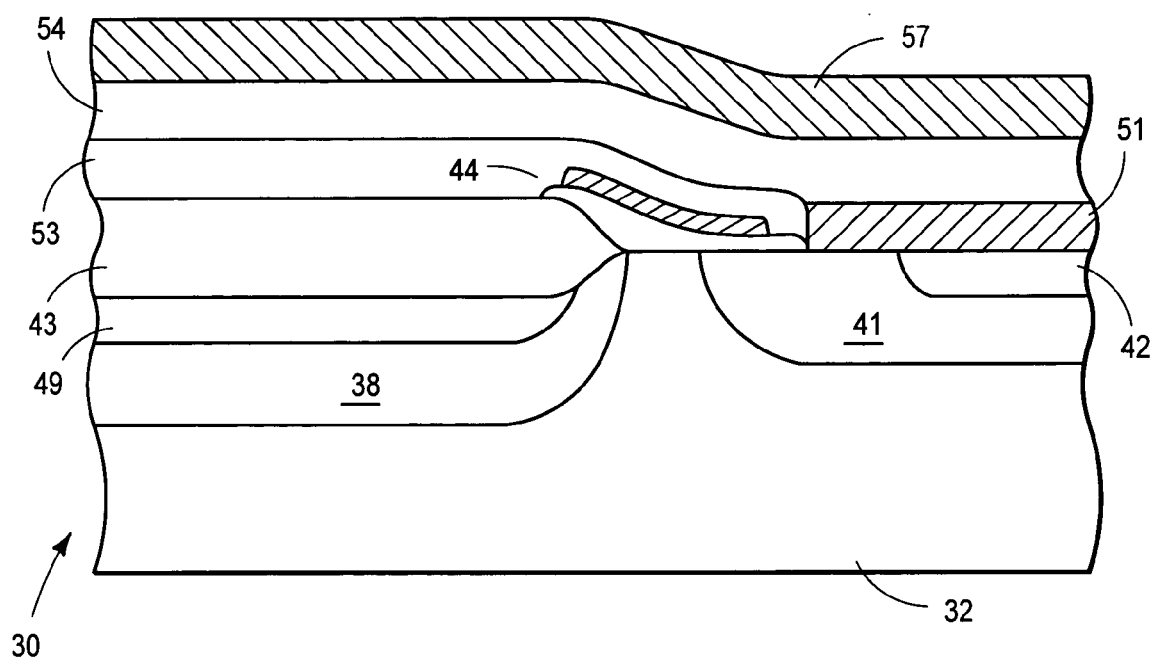
FIG. 7 illustrates an enlarged cross-sectional view of the device of FIG. 3 taken along reference line 7—7.

FIG. 7 illustrates an enlarged cross-sectional view of structure 30 taken along reference 7—7 to show an embodiment where a portion of second conductive layer 57 is over, runs over, or passes over where a portion of well region 38 terminates in body of semiconductor material 32.

An additional advantage of structure 30 is that it is scalable to multiple or a plurality of drain regions 39 depending on current carrying requirements. Also, structure 30 is easily scalable to different blocking voltages by changing drift length (Ld) (dimension 61 in FIG. 4). For example, for a >700 volt device, Ld is on the order of 60 microns, for a >500 volt device, Ld is on the order of 40 microns, and for a >200 volt device, Ld is on the order of 14 microns. An additional advantage is that structure 30 is symmetrical in any direction, which provides design layout flexibility.

A further advantage is that the drain finger design is flexible to include long drain fingers stacked side-by-side and/or to include smaller drain fingers stacked top-to-down and side-by-side using second conductive layer 57 is tie the drain regions together. Moreover, because structure 30 eliminates cut-out regions 21 and common diffused regions 17, overall device area is reduced thereby improving or reducing specific on-resistance. For example, a 700 volt structure 30 showed about a 10% reduction in specific on-resistance compared to a 700 volt device 10. Additionally, under high temperature blocking bias (HTBB) testing, structure 30 showed an increase of about 20 volts in blocking voltage after 1000 hours compared to device 10, which showed a 10 to 20 volt degradation after 1000 hours.

Thus it is apparent that there has been provided, in accordance with the present invention, a lateral FET structure having improved blocking voltage and specific on-resistance performance. The structure further provides design flexibility compared to the prior art, which improves design costs and reduces design cycle time.

Although the invention has been described and illustrated with reference to specific embodiments thereof, it is not intended that the invention be limited to these illustrative embodiments. For example, in the preferred embodiment shown herein, a first conductive layer is shown coupled to the source regions and a second conductive layer is shown coupled to the drain regions with the two conductive layers separated by an ILD layer. This order can be reversed where the first conductive layer is coupled to the drain regions, and the second conductive layer is coupled to the source regions. Those skilled in the art will recognize that modifications and variations can be made without departing from the spirit of the invention. Therefore, it is intended that this invention encompass all such variations and modifications as fall within the scope of the appended claims.

We claim:

1. A lateral FET structure comprising:
   a body of semiconductor material having a first conductivity type and a major surface;
   first and second drift regions of a second conductivity type formed in the body of semiconductor material, wherein the first and second drift regions are spaced apart and comprise elongated stripe shapes;
   a first drain contact region formed in the first drift region;
   a second drain contact region formed in the second drift region, wherein the first and second drain contacts comprise elongated striped shapes;
   a first pair of source regions formed in the body of semiconductor material and on opposing sides of the first drift region;
   a second pair of source regions formed in the body of semiconductor material and on opposing sides of the second drift region, wherein the first and second pairs of source regions comprise elongated stripe shapes, and wherein the first and second pairs of source regions are substantially parallel to the first and second drain contacts;
   a gate structure formed adjacent the first second pairs of source regions and the first and second drift regions;
   a first conductivy layer formed overlying the body of semiconductor material and connecting the first and second pairs of source regions together;
   a second conductive layer different than the first conductive layer formed overlying the body of semiconductor material and connecting the first and second drain contact regions together; and
   an insulating layer vertically separating the first and second conductive layers.

2. The structure of claim 1 wherein the first and second conductive layers overlap.

3. The structure of claim 1 wherein the first and second conductive layer do not overlap.

4. The structure of claim 1 wherein the first and second pairs of source regions comprise elongated stripe regions having rounded tips at opposing ends.

5. The structure of claim 1 wherein the second conductive layer overlies where one of the first and second drift regions terminate at the major surface.

6. The structure of claim 1 wherein the first and second pairs of source regions and the first and second drain contact regions have equal lengths.

7. The structure of claim 1 further comprising a doped region of the first conductivity type formed in the body of semiconductor material completely surrounding the first and second drift regions.

8. The structure of claim 7, wherein the first and second pairs of source regions are formed within the doped region.

9. The structure of claim 1 further comprising a doped region of the first conductivity type formed in the first drift region and spaced apart from first drain contact.

* * * * *

UNITED STATES PATENT AND TRADEMARK OFFICE
CERTIFICATE OF CORRECTION

PATENT NO. : 6,982,461 B2  
APPLICATION NO. : 10/729292  
DATED : January 3, 2006  
INVENTOR(S) : Zia Hossain et al.

Page 1 of 1

It is certified that error appears in the above-identified patent and that said Letters Patent is hereby corrected as shown below:

In claim 1, line 22: insert --and-- between "first" and "second".  
In claim 1, line 24: replace "conductivity" with --conductive--.

Signed and Sealed this

Fourteenth Day of November, 2006

JON W. DUDAS  
*Director of the United States Patent and Trademark Office*